United States Patent [19]
Lee

[11] Patent Number: 6,110,773
[45] Date of Patent: Aug. 29, 2000

[54] STATIC RANDOM ACCESS MEMORY DEVICE MANUFACTURING METHOD

[75] Inventor: Chan-jo Lee, Seoul, Rep. of Korea

[73] Assignee: Samsung Electronics Co., Ltd., Rep. of Korea

[21] Appl. No.: 09/172,441

[22] Filed: Oct. 14, 1998

Related U.S. Application Data

[62] Division of application No. 08/557,865, Nov. 13, 1995, Pat. No. 5,856,706.

[30] Foreign Application Priority Data

Dec. 31, 1994 [KR] Rep. of Korea ..................... 94-40680

[51] Int. Cl.⁷ .............................................. H01L 21/8234
[52] U.S. Cl. .......................... 438/238; 438/286; 438/281; 438/370; 438/381; 438/385; 438/391; 438/305; 438/307; 438/396; 438/637; 438/638; 438/639; 257/315; 257/316; 257/380; 257/538
[58] Field of Search ................................. 438/238, 286, 438/281, 391, 305, 307, 396, 637, 638, 639, 370, 381, 382, 385; 257/315, 316, 380, 538

[56] References Cited

U.S. PATENT DOCUMENTS

| | | | |
|---|---|---|---|
| 5,061,649 | 10/1991 | Takenouchi et al. | 438/305 |
| 5,401,994 | 3/1995 | Adan | 257/335 |
| 5,470,793 | 11/1995 | Kalnitsky | 438/970 |
| 5,576,240 | 11/1996 | Radosevich et al. | 438/396 |
| 5,736,447 | 4/1998 | Choi et al. | 438/365 |
| 5,801,416 | 9/1998 | Choi et al. | 257/335 |
| 5,852,311 | 12/1998 | Kwon et al. | 257/315 |
| 5,918,135 | 7/1999 | Lee et al. | 438/393 |
| 5,942,803 | 8/1999 | Shim et al. | 257/774 |
| 5,956,588 | 9/1999 | Choi et al. | 438/286 |

*Primary Examiner*—George Fourson
*Assistant Examiner*—Brook Kebede
*Attorney, Agent, or Firm*—Myers Bigel Sibley & Sajovec

[57] ABSTRACT

A static random access memory device includes: a semiconductor substrate divided into a cell array portion and a periphery circuit portion; a first insulating layer for insulating devices formed on the substrate from a thin-film transistor; a conductive layer formed on the first insulating layer in the cell array portion, for supplying power; a buffer layer formed on the conductive layer in the cell array portion; a second insulating layer formed on the buffer layer in the cell array portion and on the first insulating layer of the periphery circuit portion; and a metal wiring pattern formed on the second insulating layer. A first portion of the metal wiring pattern connects to the conductive layer via a first contact hole which is formed passing through the second insulating layer and the buffer layer, thus exposing the conductive layer in the cell array portion. A second portion of the metal wiring pattern connects to the substrate via a second contact hole which is formed passing through the second insulating layer and the first insulating layer, thus exposing the semiconductor substrate in the periphery circuit portion or exposing a contact to a device in the semiconductor substrate in the cell array portion. The first and second portions of the metal wiring pattern may or may not connect to each other. The buffer layer prevents over-etching caused by the difference in the etched depth of the first and second contact holes which are concurrently formed, solving the problem of poor contact to the conductive layer from the metal wiring pattern formed on the second insulating layer.

8 Claims, 6 Drawing Sheets

STATIC RANDOM ACCESS MEMORY DEVICE MANUFACTURING METHOD

This application is a division of Ser. No. 08/557,865 filed Nov. 3, 1995 now U.S. Pat. No. 5,856,706.

The present invention relates to a static random access memory (SRAM) device and a manufacturing method therefor, and more particularly, to an SRAM device having a structure in which a metal wiring layer is connected to a power thin line via a contact hole in a cell array portion which is formed simultaneously with contact hole in a periphery portion, and a manufacturing method therefor.

BACKGROUND OF THE INVENTION

In the field of semiconductor memory devices, SRAM devices are generally considered inferior to dynamic random access memory (DRAM) devices in regard to the memory capacity for given area on a chip. However, SRAM memory has been widely used in small-to-medium capacity devices, because of its high processing speed and simplicity of implementation. The SRAM memory cell is largely composed of two flip-flop circuits which include two transmitting transistors, two driving transistors and two load devices (i.e., a resistor or MOS transistor). The stored information is preserved in the SRAM memory cell as the voltage difference between the input and output terminals of the flip-flop, that is, a node-accumulated charge. This charge is supplemented from a power line via the load device. Thus, in contrast to the case with DRAM devices, SRAM memory devices do not require a refresh function.

An SRAM cell may use a depletion-type NMOS transistor as its load device, but this is no longer the common practice, owing to the high power consumption of such load device. Instead, a polycrystalline silicon resistor having high resistance has been widely used, since it consumes less power and can be easily manufactured. However, with the ever-increasing requirements for higher memory capacity, the high resistance value of the polycrystalline silicon resistor reduces the difference between load current and leakage current, which undesirably lowers the manufacturing yield of the memory device. In order to solve this problem, a CMOS-type SRAM cell which adopts a PMOS thin-film transistor (TFT) as the load device is used.

FIG. 1 is a circuit diagram of one full CMOS SRAM cell utilizing PMOS TFTs as the load resistors. The CMOS SRAM cell comprises an NMOS first transmitting transistor $T_1$ formed in one side of the cell, having a gate connected to a word line and a drain connected to a first bit line; an NMOS second transmitting transistor $T_2$ formed in the other side of the cell, having a gate connected to the word line and a drain connected to a second bit line; an NMOS first driving transistor $T_3$ having a drain connected to the source of the first transmitting transistor, a grounded ($V_{ss}$) source, and a gate connected to the source of second transmitting transistor $T_2$; an NMOS second driving transistor $T_4$ having a drain connected to second transmitting transistor $T_2$, a grounded source, and a gate connected to the source of first transmitting transistor $T_1$; a PMOS first TFT $T_5$ having a drain connected to the drain of NMOS first driving transistor $T_3$, a source connected to the power line ($V_{cc}$), and a gate connected to the gate of NMOS first driving transistor $T_3$ and to the source of NMOS second transmitting transistor $T_2$; and a PMOS second TFT $T_6$ having a drain connected to the drain of NMOS second driving transistor $T_4$, a source connected to the power line, and a gate connected to the gate of NMOS second driving transistor $T_4$ and to the source of NMOS first transmitting transistor $T_1$.

Here, a polycrystalline silicon layer used as a channel of the PMOS TFT is generally formed to a thin thickness for low current consumption and for stable data retention in the standby state. Also, the power line $V_{cc}$ is connected at a predetermined point to a metal wiring layer for carrying the power supply of the memory device, and is generally formed from the same conductive layer as the above polycrystalline silicon layer. However, when such a thin polycrystalline silicon layer is used for the power line supplying constant power to the channel of the PMOS TFT and the entire memory cell, it is difficult to connect the power line and the overlying metal wiring layer. That is, when the metal wiring layer is connected to the buried power line via a contact hole, the power line being formed in a thin conductive layer is unavoidably etched during contact hole formation, owing to the step difference between the cell array portion and the periphery circuit portion. This problem will be described in more detail with reference to FIGS. 2A and 2B.

FIG. 2A is a layout diagram showing a conventional method for connecting the power line and the metal wiring layer via a contact hole, and FIG. 2B is a cross-sectional view cut along line 2B–2B' of FIG. 2A. There is horizontal registration between FIGS. 2A and 2B, which are arranged on the same sheet of the drawing.

Referring to FIG. 2A, reference numeral 10 denotes a mask pattern for forming the power line, reference numeral 12 denotes a mask pattern for forming the metal wiring layer, and reference numerals 14 and 14' denote a first contact hole through which the metal wiring layer is connected to the power line and a second contact hole through which the metal wiring layer is connected to the substrate, respectively.

Referring to FIG. 2B, reference numeral 20 denotes a semiconductor substrate, reference numerals 22 and 26 denote first and second insulating layers, reference numeral 24 denotes a power line formed in the cell array portion of the memory device, and reference numerals 28 and 28' denote the etched patterns of the metal wiring layer, present in the cell array and periphery circuit portions, respectively.

According to the above structure, since the first and second contact holes 14 and 14' are generally formed at the same time, i.e., through the same etching process, the power line 24 formed of a very thin layer becomes etched during the formation of the contact holes, owing to the step difference of the portions on which the contact holes are formed, that is, between the cell array portion and the periphery circuit portion. That is, the etching time must be sufficiently long that the contact hole 14' in the periphery circuit portion penetrates both the insulating layers 26 and 22. While the conductive polycrystalline silicon layer 24 retards the concurrent etching of the contact hole 14 sufficiently that it does not penetrate through the insulating layer 22, there is an attendant etching back of the sides of the contact hole 14 where it passes through the conductive polycrystalline silicon layer 24. Thus, metal wiring layer 28 and power line 24 are poorly connected at the time of metal layer deposition for forming the metal wiring layer.

As a method for solving the above problem, the first and second holes may be formed separately. This method, however, overly complicates the manufacturing process.

Another method has been suggested in which the power line and the metal wiring layer are indirectly connected to each other, by first forming a $p^+$ active layer in the substrate where the contact hole is to be formed. This method will be described with reference to FIGS. 3A and 3B.

FIG. 3A is a layout diagram showing a conventional method for connecting the power line and the metal wiring layer via a p⁺ active layer, and FIG. 3B is a cross-sectional view cut along line 3B–3B' of FIG. 3A. There is horizontal registration between FIGS. 3A and 3B, which are arranged on the same sheet of the drawing. In FIGS. 3A and 3B elements similar to those in FIGS. 2A and 2B are denoted by the same reference numerals as in FIGS. 2A and 2B. In FIG. 3A reference numeral 16 denotes a mask pattern for forming a p⁺ active layer and reference numerals 15 and 15' denote contact holes for connecting p⁺ active layer 16 to the power line 24 and the metal wiring layer 28, respectively; and in FIG. 3B, reference numerals 21 and 27 respectively denote a field oxide layer and the p⁺ active layer formed in the substrate surface.

In the structure of FIGS. 3A and 3B, the power line 24 and the metal wiring layer 28 are connected via the p⁺ active layer 27. However, additional layout area is required for connecting both contact holes, thereby increasing chip size.

SUMMARY OF THE INVENTION

The invention in a first of its aspects is embodied in a static random access memory device comprising: a semiconductor substrate divided into a cell array portion and a periphery circuit portion; a first insulating layer for insulating devices formed on the substrate; a conductive layer formed on the first insulating layer in the cell array portion, for supplying power; a buffer layer formed on the conductive layer in the cell array portion; a second insulating layer formed on the buffer layer in the cell array portion and on the first insulating layer of the periphery circuit portion; and a metal wiring pattern formed on the second insulating layer. A first portion of the metal wiring pattern connects to the conductive layer via a first contact hole which is formed passing through the second insulating layer and the buffer layer, thus exposing the conductive layer in the cell array portion. A second portion of the metal wiring pattern connects to the substrate via a second contact hole which is formed passing through the second insulating layer and the first insulating layer, thus exposing the semiconductor substrate in the periphery circuit portion or exposing a contact to a device in the semiconductor substrate in the cell array portion. The first and second portions of the metal wiring pattern connect to each other in certain embodiments of the invention, but do not connect to each other in certain other embodiments of the invention. The buffer layer prevents over-etching caused by the difference in the etched depth of the first and second contact holes which are concurrently formed, solving the problem of poor contact to the conductive layer from the metal wiring pattern formed on the second insulating layer.

Preferably, the second insulating layer is a dual layer including a lower layer of high-temperature oxide (HTO) and an upper layer of borophosphosilicate glass (BPSG), and the buffer layer is formed with a thickness of 500–1000 Å from a material the etching rate of which is very low compared to that of the first and second insulating layers, such as silicon nitride.

Also, it is preferable that the conductive layer is formed with a thickness of 300–500 Å from polycrystalline silicon that, at least selectively, is highly doped for obtaining good electrical conduction. Portions of this polycrystalline silicon layer that are in effect lightly doped to form a semiconductor are used to form the channel of each of a number of thin film transistors in certain embodiments of the invention in the first of its aspects.

A second aspect of the invention concerns a method for manufacturing the above static random access memory device comprising the steps of: (a) forming a first insulating layer on a semiconductor substrate; (b) forming a conductive layer on the first insulating layer; (c) forming a buffer layer on the first insulating layer; (d) patterning the conductive and buffer layers; (e) forming a second insulating layer on the whole surface of the semiconductor layer substrate after the conductive and buffer layers are patterned; (f) concurrently forming, during a single etching procedure, a first contact hole etched through said first insulating layer for exposing said buffer layer and a second contact hole etched through both said first insulating layer and said second insulating layer for exposing said substrate; (g) exposing part of said conductive layer by etching the buffer layer exposed by said first contact hole, thus extending said first contact hole to provide an extended first contact hole; and (h) forming a metal wiring pattern, by depositing a conductive material on the entire surface of the semiconductor substrate after part of said conductive layer is exposed and patterning the deposited conductive material. A first portion of the metal wiring pattern connects via the first contact hole to the conductive layer, and a second portion of the metal wiring pattern connects via the second contact hole to the semiconductor substrate or a contact of a device in the semiconductor substrate. The first and second portions of the metal wiring pattern may be connect to each other or, alternatively, may not be so connected. The buffer layer prevents the conductive layer from being etched during the etching of contact holes through the first and second insulating layers, avoiding over-etching of the conductive layer while permitting the contact holes having different depth to be concurrently formed. Preferably, the buffer layer is formed of silicon nitride, the first insulating layer is made of high-temperature oxide (HTO) and second insulating layer is made of HTO and borophosphosilicate glass (BPSG), respectively. Also, it is preferable that the conductive layer is polycrystalline silicon, a portion of which polycrystalline silicon layer that is heavily doped being used as a power line and a portion of which polycrystalline silicon layer that is in effect lightly doped being used as a channel of a thin-film transistor.

DETAILED DESCRIPTION OF THE INVENTION

Figure 4:
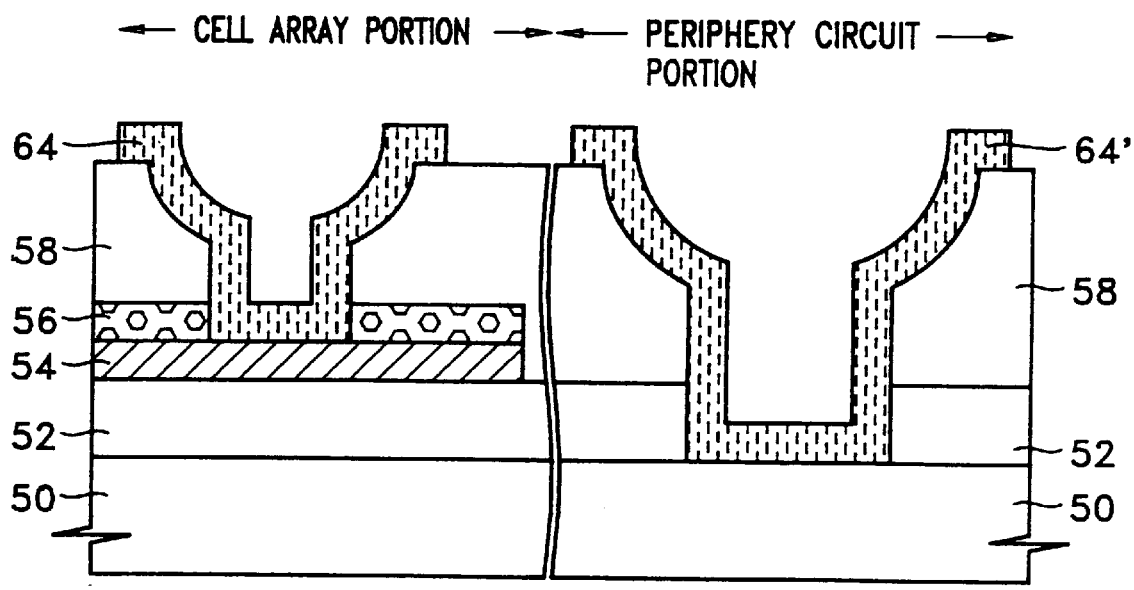
FIG. 4 is a cross-sectional diagram showing the structure of a static random access memory device embodying a first aspect of the invention.

Referring to FIG. 4, reference numeral 50 denotes a semiconductor substrate, reference numeral 52 denotes a first insulating layer for insulating between lower devices and a thin-film transistor (TFT), reference numeral 54 denotes a conductive layer for supplying constant power to the cell, reference numeral 56 denotes a buffer layer formed for preventing conductive layer 54 from being etched during contact hole formation, reference numeral 58 denotes a second insulating layer for insulating conductive layer 54 and for planarizing the uneven surface (step) caused by the underlying structure, and reference numerals 64 and 64' denote first and second patterns of the metal wiring layer which are formed in the cell array and periphery circuit portions and are connected to the conductive layer 54 via first and second is contact holes $h_1$ and $h_2$ (see FIG. 5D), respectively. Here, the conductive layer 54 is formed to a very thin thickness since, in SRAM devices, it is used as the TFT channel as well as the power line.

In FIG. 4 the buffer layer 56 is made of a material having an etching rate that is very low compared to that of the first and second insulating layers 52 and 58, to prevent the conductive layer 54 from being etched during the formation of first and second contact holes $h_1$ and $h_2$. It is preferred that the first insulating layer 52 is made of high-temperature oxide (HTO), that the second insulating layer 58 is made of HTO and borophosphosilicate glass (BPSG), and that the buffer layer 56 is made of silicon nitride. The HTO and BPSG layers will be selectively etched at much faster rate than the silicon nitride buffer layer 56.

Since the buffer layer is in accordance with the invention made of a material the etching rate of which is very low compared to the layers which are etched during the formation of the contact hole, it acts as an etching preventing layer, so the thin conductive layer is not appreciably etched even when the contact holes are concurrently formed in the cell array portion and the periphery circuit portion during the same etching procedure. Thus, the thin power line and metal wiring layer can be reliably connected via the first contact hole.

FIGS. 5A to 5E are diagrams sequentially showing the method for manufacturing the static random access memory device in accordance with the second aspect of the invention.

Figure 5A:
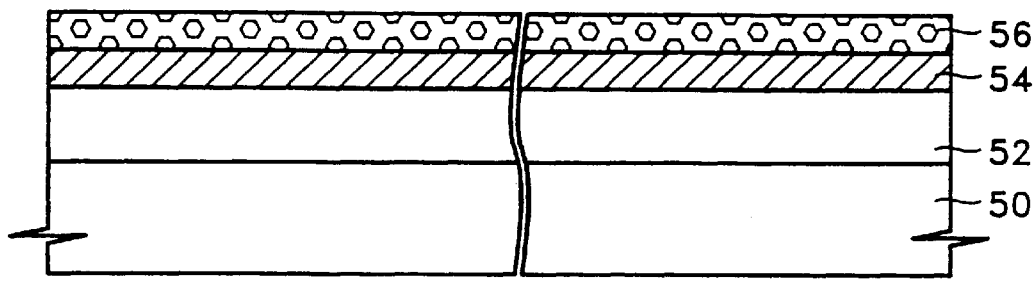
FIGS. 5A–5E are diagrams sequentially showing the method for manufacturing the static random access memory device in accordance with a second aspect of the invention.

FIG. 5A shows the step for forming the conductive layer 54 and the buffer layer 56. First, the insulating layer 52 for insulating the lower layers and the thin-film transistor is formed by depositing silicon oxide, e.g., HTO. Then, the conductive layer 54 (from which the power line and the source and drain channel-end connections of each TFT will subsequently be formed) is formed by depositing heavily doped polycrystalline silicon on the first insulating layer 52. Next, ions are implanted in the channel regions (not shown) of each TFT channel to counteract the doping in the channel regions and make the polycrystalline silicon semiconductive and in effect lightly doped. Then, the buffer layer 56 is formed on conductive layer 54 with an insulating material the etching rate of which is very low compared to that of the HTO and BPSG layers, such as silicon nitride. Preferably, the thickness of buffer layer 56 is 500–1000 Å.

One skilled in the art of semiconductor device processing will understand that there are alternative ways the differential doping of the polycrystalline silicon layer can be accomplished. For example, a lightly doped polycrystalline silicon layer can be deposited on the first insulating layer 52, with subsequent ion implantation being used to increase the doping of those portions of the polycrystalline silicon layer to be used as power line (or other connection bus) and as TFT drain and source contacts. There are fewer masking problems with differential doping of the polycrystalline silicon layer as described in the preceding paragraph. Doing all the doping of the polycrystalline silicon layer after it is grown is also possible, of course, but involves more processing substeps.

Figure 5B:
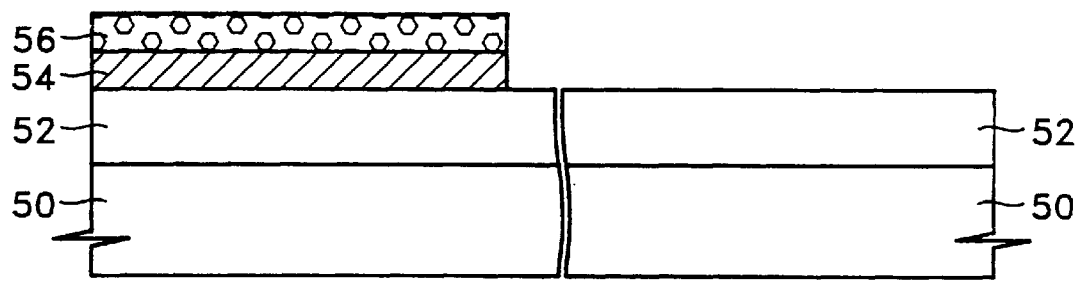

FIG. 5B shows the steps for patterning the conductive layer 54 to form the TFT channel and the power line. It is preferable that the buffer layer 56 is simultaneously patterned. This is done using a known non-selective dry etching technique in which 1:1 etching selectivity is maintained by control of the gas flow rate, RF power, chamber temperature, chamber pressure etc.

Figure 5C:
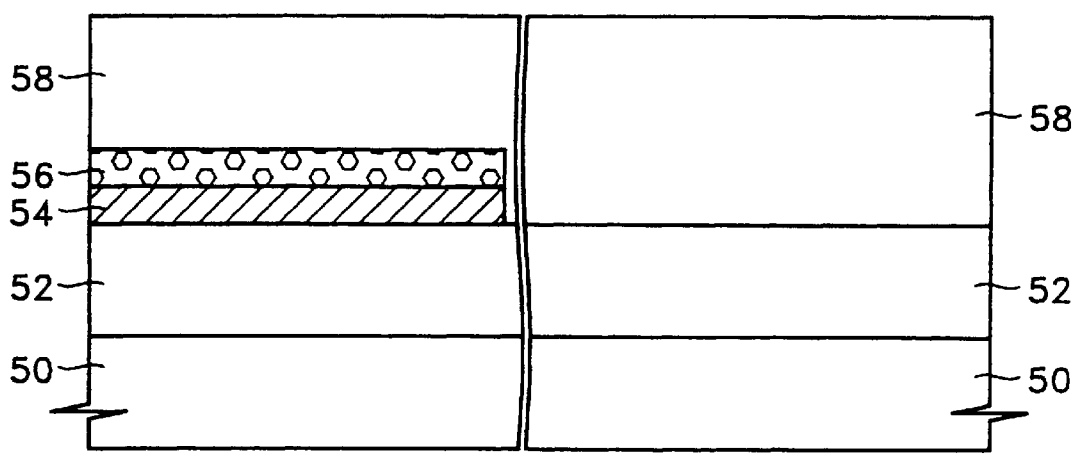

FIG. 5C shows the step for forming the second insulating layer 58. The second insulating layer 58 for insulating the conductive layer 54 and for planarizing the uneven surface caused by the underlying structure is formed by sequentially depositing insulating materials, e.g., HTO and BPSG, on the patterned conductive layer 54 and the overlying buffer layer 56. HTO is used in this step for preventing the boron (B) and phosphorus (P) of the BPSG from being diffused to the sides of conductive layer 54.

Figure 5D:
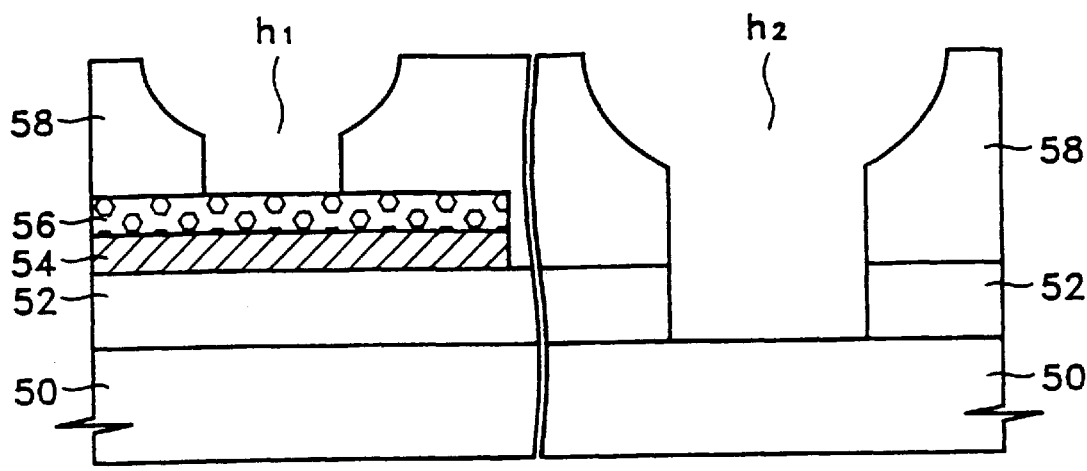

FIG. 5D shows the step for forming first and second contact holes $h_1$ and $h_2$. Photoresist is deposited on the whole surface of the structure resulting after the second insulating layer 58 is formed and a photoresist pattern (not shown) is formed using a mask pattern for contact formation. The second insulating layer 58 is then selectively wet-etched to part of its thickness using the photoresist pattern as an is etching mask and then dry-etching is performed with respect to the remaining thickness of the second insulating layer 58 and in the periphery circuit portion, with respect to the first insulating layer 52. As a result, first contact hole $h_1$ for exposing the buffer layer 56 in the cell array portion of the memory and the second contact hole $h_2$ for exposing the substrate in the periphery circuit portion are concurrently formed on the substrate. Thus, the buffer layer 56, being formed of a material the etching rate of which is very low compared to the first and second insulating layers 52 and 58, prevents the underlying conductive layer 54 from being etched during the formation of the first and second contact holes $h_1$ and $h_2$.

Figure 5E:
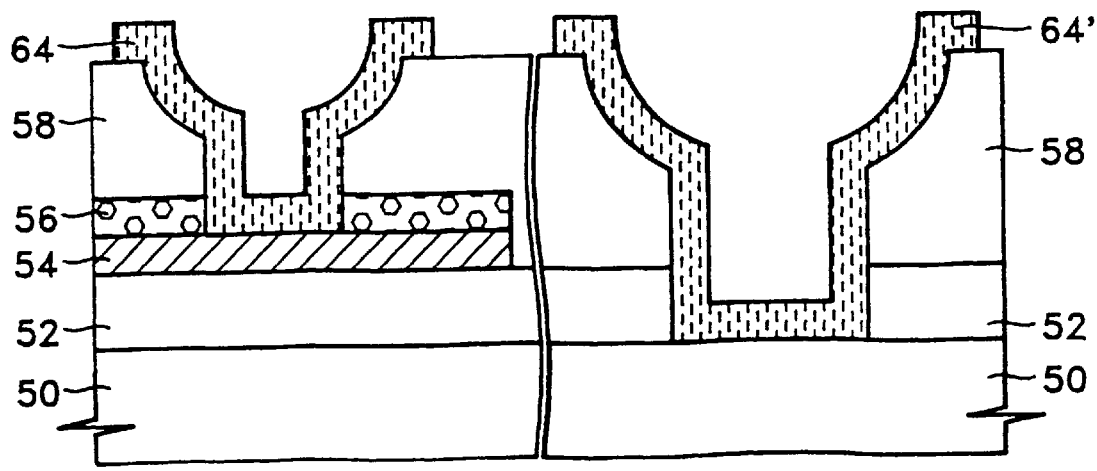

FIG. 5E shows the step for forming the first and second patterns 64 and 64' of the metal wiring layer. First, the conductive layer 54 is exposed by etching the portion of the buffer layer 56 exposed in the first contact hole $h_1$ and then the metal layer is formed on the whole surface of the resultant by depositing a conductive material. Subsequently, the first pattern 64 connected to the conductive layer 54 and the second pattern 64' connected to the substrate 50 are formed by patterning the deposited conductive material.

According to the manufacturing method described above, when the contact holes are concurrently formed to different depths from each other, the problem of a too-small etching margin resulting from the difference in the etching amount can be solved. Thus, a contact hole for connecting the power line and the metal wiring layer in the memory cell region and a contact hole for connecting the substrate and the metal layer in the peripheral circuit portion, can be concurrently formed.

Figure 1:
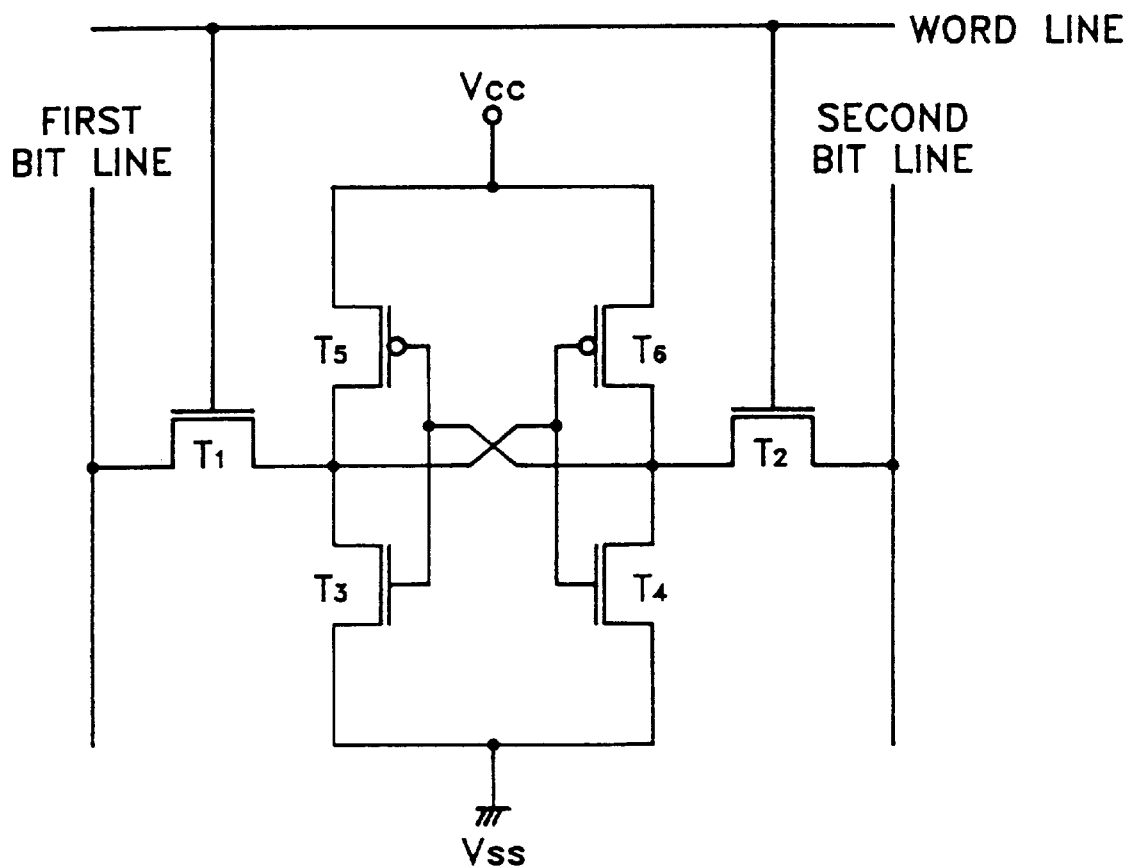
FIG. 1 is a general circuit diagram of a CMOS SRAM cell using a PMOS TFT as a load resistor.
Figure 2A:
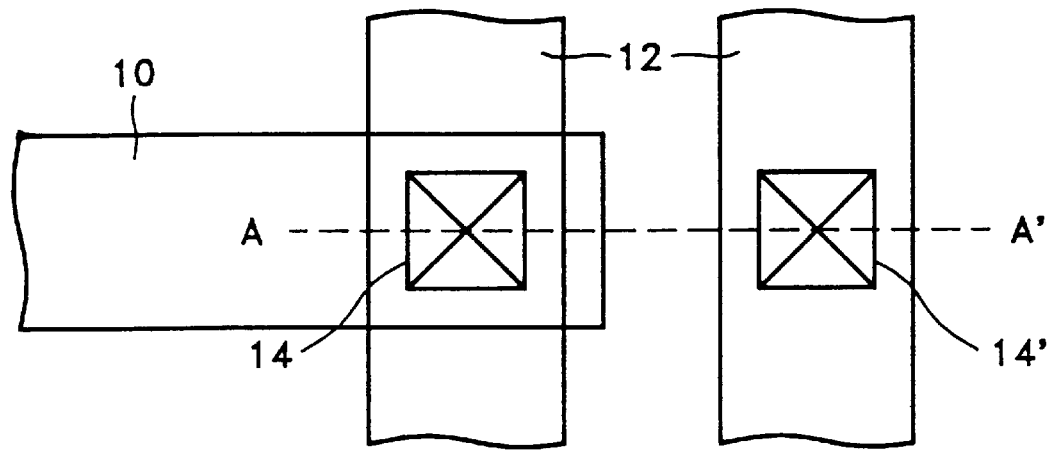
FIG. 2A is a layout diagram showing a conventional method for connecting a power line and a metal wiring layer via a contact hole.
Figure 2B:
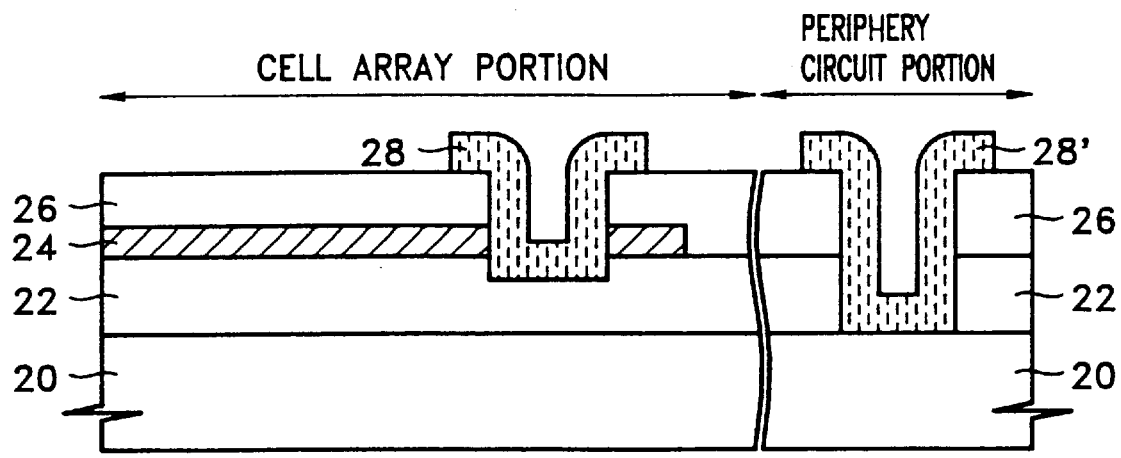
FIG. 2B is a vertical cross-sectional diagram cut along line 2B–2B' of FIG. 2A.
Figure 3A:
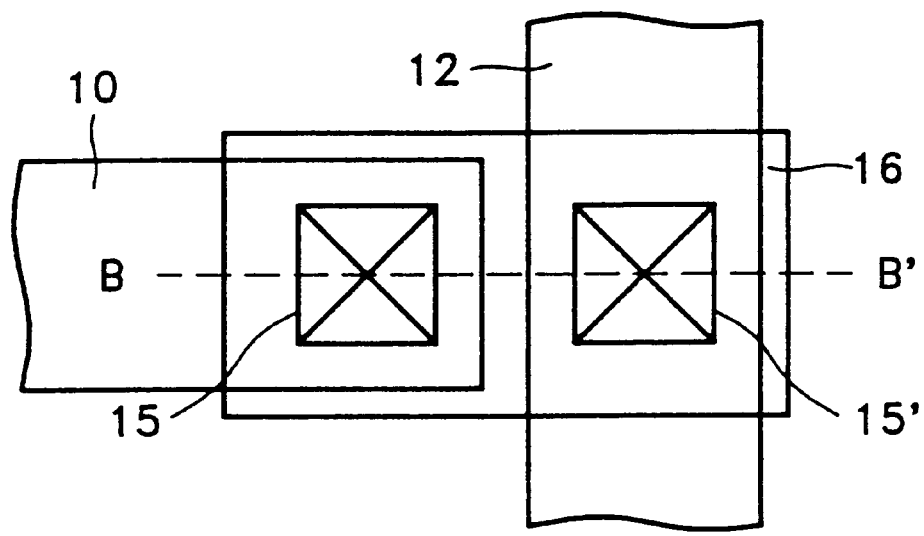
FIG. 3A is a layout diagram showing a conventional method for connecting a power line and a metal wiring layer via a p⁺ active layer.
Figure 3B:
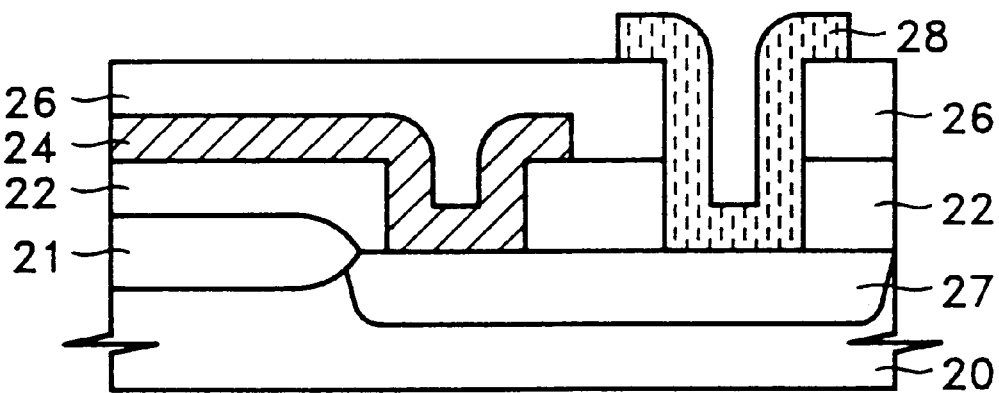
FIG. 3B is a vertical cross-sectional diagram cut along line 3B–3B' of FIG. 3A.

The present invention is not limited to the particular embodiment illustrated and further modifications and improvements in accordance with the invention will occur to those skilled in the art and acquainted with the foregoing disclosure. As a specific example, while power line connections to the sources of the TFTs have been particularly described, connection from the drains of the TFTs to the overlying metal wiring layer and subsequent connection from that metal wiring layer to the drains of complementary conductivity MOS transistors having their channels in the semiconductor substrate can be done in accordance with the precepts set forth above, for completing other of the SRAM memory cell connections shown in FIG. 1, in an alternative embodiment of the invention. The precepts of the invention may be embodied in other multiple-connection-level integrated circuitry in which contact holes of differing depth are made to different connection levels. The claims which follow should be liberally construed to include such alternative embodiments of the invention within their scope.

What is claimed is:

1. A method for manufacturing a static random access memory device, said method comprising the steps of:

forming a first insulating layer on a semiconductor substrate;

forming a conductive layer on said first insulating layer;

forming a buffer layer on said conductive layer;

patterning said conductive layer and said buffer layer;

forming a second insulating layer on said semiconductor substrate after said conductive layer and said buffer layer are patterned;

concurrently forming, a first contact hole etched through said second insulating layer for exposing said buffer layer and a second contact hole etched through both said first insulating layer and said second insulating layer for exposing said substrate;

exposing part of said conductive layer by etching the buffer layer exposed by said first contact hole, thus extending said first contact hole to provide an extended first contact hole; and forming a metal wiring pattern having a first portion connected to said conductive layer through said extended first contact hole and having a second portion connected to said substrate through said second contact hole, by depositing a conductive material on the semiconductor substrate after part of said conductive layer is exposed and patterning the deposited conductive material.

2. The method claimed in claim 1, wherein said buffer layer prevents said conductive layer from being etched during the procedure used in the step for concurrently forming said first and second contact holes.

3. The method claimed in claim 1, wherein said buffer layer comprises silicon nitride.

4. A method of manufacturing a static random access memory device, said method comprising the steps of:

forming a first insulating layer of high-temperature oxide on a semiconductor substrate;

forming a conductive layer on said first insulating layer;

forming a buffer layer on said conductive layer;

patterning said conductive layer and said buffer layer;

forming a second insulating layer on said semiconductor substrate after said conductive layer and said buffer layer are patterned, said second insulating layer comprising a lower layer of high-temperature oxide and an upper layer of borophosphosilicate glass;

concurrently forming, a first contact hole etched through said second insulating layer for exposing said buffer layer and a second contact hole etched through both said first insulating layer and said second insulating layer for exposing said substrate;

exposing part of said conductive layer by etching the buffer layer exposed by said first contact hole; and forming a patterned metal wiring pattern having a portion connected to said first conductive layer through said extended contact hole and having a second portion connected to said substrate through said second contact hole, by depositing conductive material on the semiconductor substrate after part of said conductive layer is exposed and thereafter patterning the deposited conductive material.

5. The method claimed in claim 1, wherein said first contact hole is formed in a cell array portion of the static random access memory device and said second contact hole is formed in a periphery circuit portion of the static random access memory device.

6. The method claimed in claim 1, wherein said conductive layer comprises polycrystalline silicon that is heavily doped except in portions thereof in which a channel of a thin-film transistor is to appear, and wherein said conductive layer is patterned so heavily doped portions thereof provide a power line connection and provide channel-end connections for each said thin-film transistor.

7. The method claimed in claim 1, wherein said first insulating layer comprises high-temperature oxide, and wherein said second insulating layer comprises a lower layer of high-temperature oxide and an upper layer of borophosphosilicate glass.

8. The method claimed in claim 1, wherein said first and second portions of said metal wiring pattern are not connected to each other.

* * * * *

UNITED STATES PATENT AND TRADEMARK OFFICE
CERTIFICATE OF CORRECTION

PATENT NO. : 6,110,773
DATED : August 29, 2000
INVENTOR(S) : Chan-jo Lee

It is certified that error appears in the above-identified patent and that said Letters Patent is hereby corrected as shown below:

At column 7, line 25, please delete ",".
At column 8, line 12, please delete ",".
At column 8, line 20, please delete "patterned".
At column 8, line 21, please delete "first".

Signed and Sealed this

Seventeenth Day of April, 2001

Attest:

NICHOLAS P. GODICI

Attesting Officer        Acting Director of the United States Patent and Trademark Office